(12) United States Patent
Asai et al.

(10) Patent No.: US 7,745,975 B2
(45) Date of Patent: Jun. 29, 2010

(54) PIEZOELECTRIC THIN FILM RESONATOR, PIEZOELECTRIC THIN FILM RESONATOR FILTER AND MANUFACTURING METHOD THEREOF

(75) Inventors: Kengo Asai, Hachioji (JP); Hisanori Matsumoto, Kokubunji (JP); Atsushi Isobe, Kodaira (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 577 days.

(21) Appl. No.: 11/704,995

(22) Filed: Feb. 12, 2007

(65) Prior Publication Data
US 2008/0169728 A1     Jul. 17, 2008

(30) Foreign Application Priority Data
Jan. 15, 2007   (JP) .............................. 2007-006117

(51) Int. Cl.
*H01L 41/08* (2006.01)
(52) U.S. Cl. .................... 310/331; 310/324; 367/68; 367/70
(58) Field of Classification Search ................ 310/320, 310/324, 334
See application file for complete search history.

(56) References Cited

U.S. PATENT DOCUMENTS

| 5,821,833 | A * | 10/1998 | Lakin ........................ 333/187 |
| 7,126,253 | B2 * | 10/2006 | Unterberger ................ 310/320 |
| 7,235,915 | B2 * | 6/2007 | Nakamura et al. .......... 310/335 |
| 7,382,078 | B2 * | 6/2008 | Bradley ..................... 310/320 |

FOREIGN PATENT DOCUMENTS

| JP | 2002-251190 | 9/2002 |
| JP | 2004-079869 | 3/2004 |
| JP | 2004-200843 | 7/2004 |
| JP | 2005-303573 | 10/2005 |
| JP | 2005-318420 | 11/2005 |
| JP | 2006-028230 | 2/2006 |
| JP | 2006-332730 | 12/2006 |

OTHER PUBLICATIONS

"Comparison of Micromachined FBAR Band Pass Filters with Different Structural Geometry", Park et al, 2003 IEEE MTT-S Digest, pp. 2005-2008.

* cited by examiner

*Primary Examiner*—Mark Budd
(74) *Attorney, Agent, or Firm*—Mattingly & Malur, P.C.

(57) ABSTRACT

A piezoelectric thin film resonator includes: a piezoelectric thin film; a laminated structure which includes a first metal electrode film and a second metal electrode film that interpose at least a part of the piezoelectric thin film, and which is formed on a substrate; and an acoustic insulating layer which is formed on the substrate at a position corresponding to the laminated structure, wherein the first metal electrode film is formed on the substrate and the second metal electrode film is formed on the first metal electrode film while sandwiching the piezoelectric thin film, and a protection film laminated on the second metal electrode film is provided so as to cover the second metal electrode film.

16 Claims, 11 Drawing Sheets

PIEZOELECTRIC THIN FILM RESONATOR, PIEZOELECTRIC THIN FILM RESONATOR FILTER AND MANUFACTURING METHOD THEREOF

CLAIM OF PRIORITY

The present invention application claims priority from Japanese application JP2007-6117 filed on Jan. 15, 2007, the content of which is hereby incorporated by reference into this application.

FIELD OF THE INVENTION

The present invention relates to a piezoelectric thin film resonator, a piezoelectric thin film resonator filter and a manufacturing method thereof, and particularly to a resonator which utilizes piezoelectric/anti-piezoelectric effects of a thin film piezoelectric body and a resonance phenomenon of a bulk acoustic wave (hereinafter, abbreviated as a piezoelectric thin film bulk acoustic wave resonator). In addition, the present invention relates particularly to a piezoelectric thin film bulk acoustic wave resonator filter, a thin film tuning-fork-shape distorting oscillator, and a high frequency module, all of which use the resonator, and a manufacturing method thereof.

BACKGROUND OF THE INVENTION

A piezoelectric thin film bulk acoustic wave resonator generally includes a piezoelectric thin film deposited by a thin film forming apparatus, and a resonator unit composed of a first metal electrode film and a second metal electrode film, which are located above and below while sandwiching at least a part of the piezoelectric thin film. The first metal electrode film functions as a lower electrode, and the second metal electrode film functions as an upper electrode. The piezoelectric thin film is polarized in the thickness direction. An alternating electric field generated by alternating voltage that is applied between the lower electrode and the upper electrode causes stretching of the piezoelectric thin film in the thickness direction, namely an acoustic wave by piezoelectric/anti-piezoelectric effects.

There exist acoustic insulating layers above and below the resonator composed of the piezoelectric thin film, the lower electrode, and the upper electrode. The piezoelectric thin film bulk acoustic wave resonator suitable for a high frequency filter is classified based on methods by which a bulk acoustic wave is sealed inside the piezoelectric thin film, and FBAR (Film Bulk Acoustic wave Resonator) and SMR (Solidly Mounted Resonator) are well known. An interface between a solid body and gaseous matter (or, vacuum) functions as an effective acoustic insulating layer, and therefore areas above and below the resonator are in a gaseous state (or, vacuum state) in FBAR. An area above the upper electrode is in a gaseous state (or, vacuum state), and a Bragg reflector is mounted below the lower electrode in SMR.

U.S. Pat. No. 6,496,085 B2 discloses the device configuration of SMR and a process flow thereof. Japanese Patent Application Laid-Open No. 2005-303573 proposes a resonator structure in which AlN is formed only on a lower electrode and no bump is formed on an upper electrode due to AlN high orientation. Further, US 2005/0248232 A1 describes an improvement of AlN orientation by sequential deposition of a lower electrode and a piezoelectric film, and an electromechanical coupling coefficient. The above US 2005/0248232 A1 describes that flatness and cleaning properties immediately after deposition are not maintained on a surface of the lower electrode due to adsorption of impurities in conventional piezoelectric film manufacturing process ([0008]).

Further, Japanese Patent Application Laid-Open No. 2004-200843 discloses a manufacturing method which aims at reducing a cost in such a manner that a support film is made of AlN, and a sacrificial layer for forming an oscillation space, the support film, a lower electrode film, a piezoelectric thin film, and an upper electrode film are sequentially deposited in the same apparatus.

Further, "Comparison of Micromachined FBAR Band Pass Filters with Different. Structural Geometry" (Park et al, 2003 IEEE MTT-S Digest, pp. 2005-2008) discloses the device configuration of FBAR and a process flow thereof.

On the other hand, a thin film tuning-fork-shape distorting oscillator is composed of, as similar to the piezoelectric thin film bulk acoustic wave resonator, a piezoelectric thin film deposited by a thin film forming apparatus, and a first metal electrode film and a second metal electrode film which are located above and below while sandwiching a part of the piezoelectric thin film, and is a distorting oscillator in which the piezoelectric thin film is patterned in a tuning-fork shape.

U.S. Pat. No. 7,083,740 B2 discloses the resonance device configuration of a thin film tuning-fork-shape distorting oscillator and a manufacturing method thereof.

SUMMARY OF THE INVENTION

A piezoelectric thin film bulk acoustic wave resonator is characterized in that a Q-value is generally high. However, a trend of new systems requires a much higher Q-value. Similarly, a much higher Q-value as well as downsizing of the system, a high natural resonance frequency, a wide bandwidth, little fluctuation in electric characteristics with respect to process changes, and a low cost is required for a thin film tuning-fork-shape distorting oscillator.

In order to produce a piezoelectric thin film bulk acoustic wave resonator filter using a piezoelectric thin film bulk acoustic wave resonator, it is necessary to electrically connect two or more piezoelectric thin film bulk acoustic wave resonators having different resonance frequencies with each other. For this purpose, a general manufacturing process is as follows. A lower electrode layer located below a piezoelectric thin film is formed in an arbitrary shape so as to be connected between plural resonators, and then a piezoelectric layer and an upper electrode layer are formed. The manufacturing process is disclosed in U.S. Pat. No. 6,496,085 B2, Japanese Patent Application Laid-Open No. 2005-303573 and "Comparison of Micromachined FBAR Band Pass Filters with Different Structural Geometry".

The manufacturing process disclosed in the "Comparison of Micromachined FBAR Band Pass Filters with Different Structural Geometry" will be described below as a conventional technique. First, a lower electrode is deposited so as to cover a silicon substrate, and is patterned in an arbitrary shape. Next, a piezoelectric thin film is deposited so as to cover a surface of the lower electrode pattern and a surface of the silicon substrate exposed by removing the lower electrode, and is patterned in an arbitrary shape. By patterning the piezoelectric thin film, a part of the lower electrode is exposed. Next, the lower electrode is deposited so as to cover a surface of the piezoelectric thin film and a surface of the silicon substrate exposed by removing the piezoelectric thin film, and is patterned in an arbitrary shape. Finally, by etching a part of a back surface of the silicon substrate, a cavity is formed immediately below a resonator unit. The piezoelectric thin film bulk acoustic wave resonator can be obtained by the above manufacturing method.

In the element structure, each of the first metal electrode film, the piezoelectric thin film, and the second metal electrode film is exposed in the air for pattering in mid-course of manufacturing. Due to this, oxygen and nitrogen are mixed inside the piezoelectric thin film and the metal electrode film. Along with this, inner portions (bulk portions) of the respective piezoelectric film layer and the metal electrode film layer are different from epidermic portions thereof in material composition, and these layers come into contact with each other through an interface. There is concern that such changes of the materials in the epidermic portions of the piezoelectric film layer and the metal electrode film layer have an adverse effect on element characteristics of the piezoelectric thin film bulk acoustic wave resonator.

On the other hand, since the first metal electrode film and the piezoelectric thin film are sequentially deposited in US 2005/0248232 A1 ([0034]), and the first metal electrode film, the piezoelectric thin film, and the second metal electrode film are sequentially deposited in Japanese Patent Application Laid-Open No. 2004-200843, it is conceivable that effects on element characteristics of the piezoelectric thin film bulk acoustic wave resonator are alleviated as compared to the former manufacturing method.

However, even in the case of the latter manufacturing methods, the piezoelectric thin film and the second metal electrode film (US 2005/0248232 A1), or the second metal electrode film (Japanese Patent Application Laid-Open No. 2004-200843) is exposed in the air in mid-course of manufacturing. Along with this, concern still remains in that mixing of oxygen and nitrogen inside the piezoelectric thin film and the second metal electrode film has an adverse effect on element characteristics of the piezoelectric thin film bulk acoustic wave resonator.

Even for a thin film tuning-fork-shape distorting oscillator, the conventional technique disclosed in U.S. Pat. No. 7,083,740 B2 involves a problem similar to the piezoelectric thin film bulk acoustic wave resonator.

The issue of the present invention is to address conventional problems according to the above-described resonator structure forming technique, and an object thereof is to provide a piezoelectric thin film bulk acoustic wave resonator or a thin film tuning-fork-shape distorting oscillator which can realize a good characteristic of film quality, and a manufacturing method thereof.

A representative example of the present invention is as follows. That is, a piezoelectric thin film resonator comprising: a piezoelectric thin film; a laminated structure which includes a first metal electrode film and a second metal electrode film that interpose at least a part of the piezoelectric thin film, wherein the laminated structure being formed on a substrate; and an acoustic insulating layer which is formed on the substrate at a position corresponding to the laminated structure, wherein the first metal electrode film is formed on the substrate, and the second metal electrode film is formed on the first metal electrode film while sandwiching the piezoelectric thin film, and a protection film laminated on the second metal electrode film which is provided so as to cover the second metal electrode film.

According to the present invention, deterioration of film quality due to oxidization of each thin film can be prevented to the minimum degree, and a piezoelectric thin film resonator with a good characteristic of film quality can be provided.

DETAILED DESCRIPTION OF THE PREFERRED EMBODIMENTS

Figure 1A:
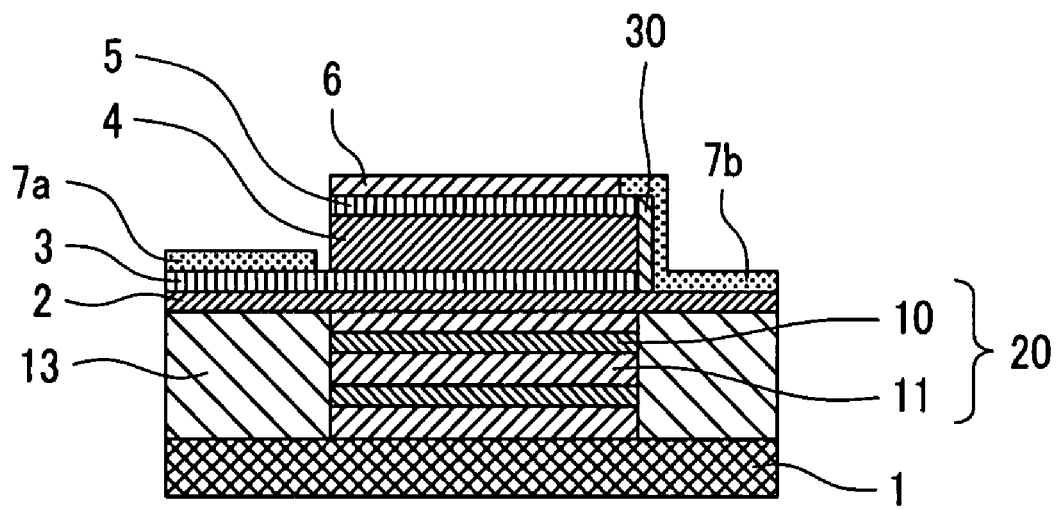
FIG. 1A is a longitudinal sectional structured view of a piezoelectric thin film bulk acoustic wave resonator according to a first embodiment of the present invention.

Hereinafter, a piezoelectric thin film resonator, a piezoelectric thin film resonator filter, and a manufacturing method thereof according to the present invention will be described in more detail with reference to several preferred embodiments shown in the drawings.

It should be noted that a thin film described in the present invention is a film prepared by a deposition apparatus. Further, the deposition apparatus described in the present invention is an apparatus which is typified by a sputtering apparatus, a vapor deposition apparatus and a CVD apparatus, and which prepares a film by directly laminating molecules, atoms, ions or clusters thereof on a substrate, or by laminating them with chemical reactions.

Therefore, the thin film described in the present invention excludes members other than a film prepared by a deposition apparatus, such as a sintered body prepared by sintering and a bulk body formed by a hydrothermal synthesis method, a Czochralski method or the like, irrespective of their thicknesses.

First Embodiment

A first embodiment of a piezoelectric thin film bulk acoustic wave resonator according to the present invention will be described with reference to FIGS. 1A to 6.

Figure 1B:
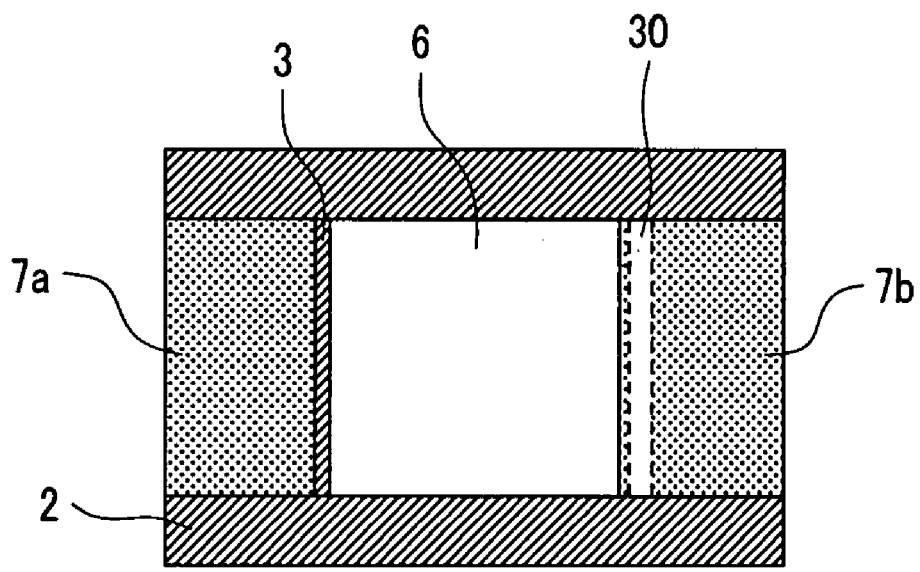
FIG. 1B is a top view of the piezoelectric thin film bulk acoustic wave resonator shown in FIG. 1A.
Figure 2:
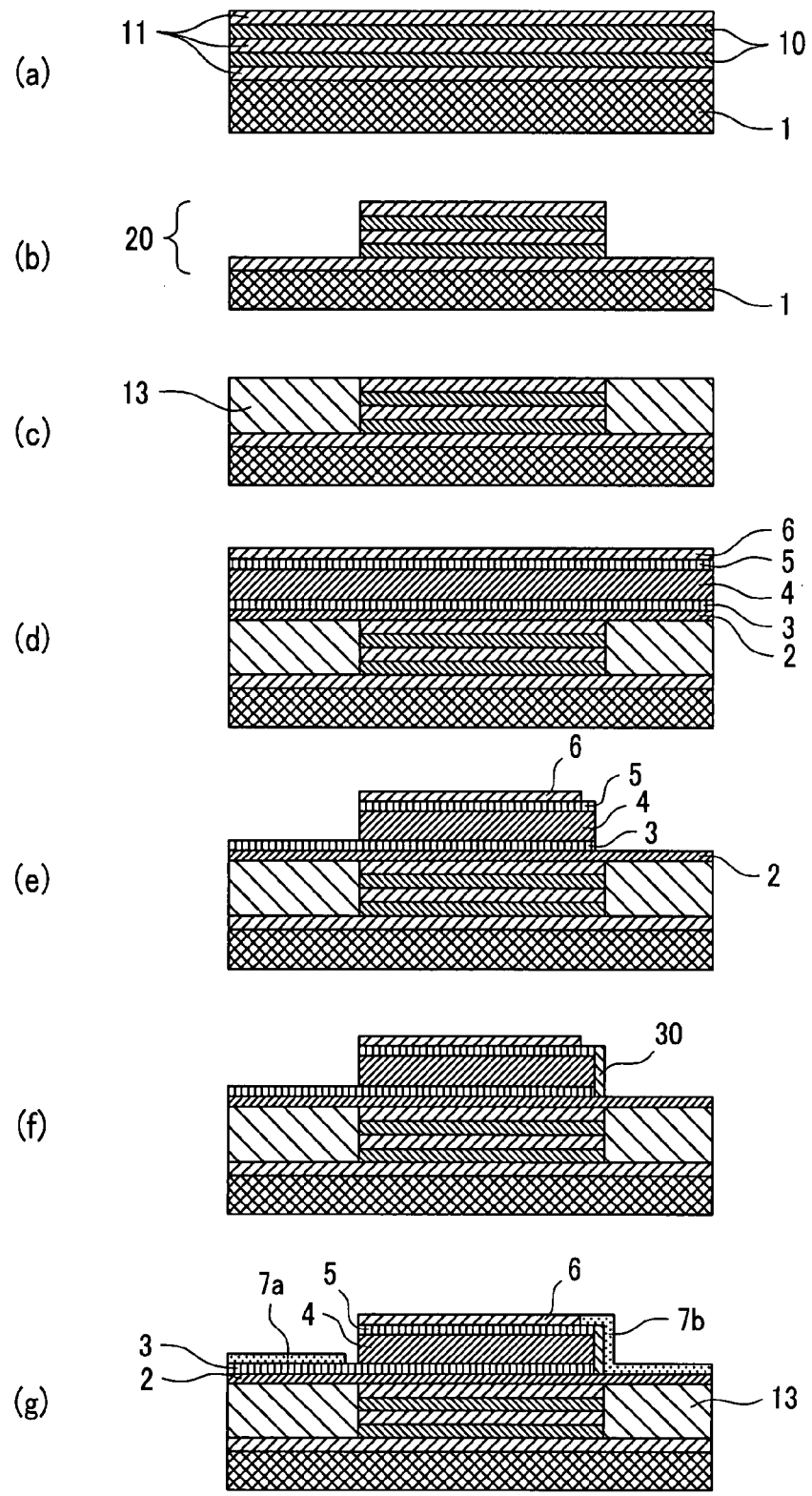
FIG. 2A to FIG. 2G are sectional structured views showing an example of a manufacturing method of the piezoelectric thin film bulk acoustic wave resonator according to the first embodiment in the order of manufacturing processes.

First, a structure of the piezoelectric thin film bulk acoustic wave resonator according to the first embodiment will be described with reference to FIG. 1A and FIG. 1B. FIG. 1A is a longitudinal sectional structured view of the piezoelectric thin film bulk acoustic wave resonator according to the first embodiment. FIG. 1B is a top view of the piezoelectric thin film bulk acoustic wave resonator shown in FIG. 1A.

The piezoelectric thin film bulk acoustic wave resonator according to the first embodiment includes: a support film 2 made of AlN on an acoustic insulating layer 20 produced on an insulating substrate 1; and a laminated structure, on the support film 2, which has a piezoelectric thin film 4, and a first metal electrode film 3 and a second metal electrode film 5 that interpose at least a part of the piezoelectric thin film 4. As a material of the first metal electrode film 3 and the second metal electrode film 5, for example, Mo is used, and as a material of the piezoelectric thin film 4, AlN is used. A protection film 6 made of an insulating material, or a thin film made of $SiO_2$ in this case is formed so as to cover an upper surface of the second metal electrode film 5 which serves as an upper electrode. Among a pair of pad electrodes 7 (7a, 7b), a first pad electrode 7a is formed on the first metal electrode film 3, and a second pad electrode 7b formed on the support film 2 is connected with an upper surface of the second metal electrode film 5. The numerals 13 and 30 denote a flat layer and an insulating film, respectively. The second metal electrode film 5 is covered with the protection film 6 throughout the whole upper surface of an area where at least the laminated structure substantially functions as a resonator. In the first embodiment, the whole upper surface of the second metal electrode film 5 is covered with the protection film 6 and the second pad electrode 7b.

It should be noted that the support film 2, the first metal electrode film 3, the piezoelectric thin film 4, the second metal electrode film 5, and the protection film 6 are sequentially deposited in vacuum, as will be described later, and are not exposed in the air. Accordingly, the respective films of the support film 2 and the first metal electrode film 3, the first metal electrode film 3 and the piezoelectric thin film 4, the piezoelectric thin film 4 and the second metal electrode film 5, and the second metal electrode film 5 and the protection film 6 come into contact with each other through an interface their between, respectively. That is, oxygen, nitrogen, or moisture is mixed between the respective films, so that an epidermic layer that is different in composition from an inner portion (bulk portion) of each layer is present. As a result, forming of an interface between the epidermic portion of the piezoelectric film layer or the metal electrode film layer, and the inner portion thereof, in other words, deterioration of film quality due to oxidization or nitridation of each thin film in a deposition process can be prevented to the minimum degree. Therefore, it is possible to manufacture a piezoelectric thin film bulk acoustic wave resonator which has a good characteristic of film quality and which is excellent in element characteristics.

The first embodiment is an embodiment in which a piezoelectric thin film bulk acoustic wave resonator of an SMR type is exemplified, and in which low acoustic impedance films 11 and high acoustic impedance films 10 are alternately formed as the acoustic insulating layer 20 on the insulating substrate 1, the high acoustic impedance films 10 are patterned in a shape of a resonator, and then the low acoustic impedance films 11 are embedded thereto so as to be made flat.

Hereinafter, one example of a manufacturing method of the piezoelectric thin film bulk acoustic wave resonator according to the first embodiment will be described along with FIG. 2A to FIG. 2G.

First, the acoustic insulating layer 20 is formed on a high-resistance silicon substrate as the insulating substrate 1. A piezoelectric thin film bulk acoustic wave resonator of an SMR type is exemplified in this case, so that the low acoustic impedance film 11 made of $SiO_2$ is deposited so as to have a thickness of 700 nm, and then the high acoustic impedance film 10 made of W is deposited so as to have a thickness of 700 nm by a deposition apparatus. Further, $SiO_2$ is deposited so as to have a thickness of 700 nm, W is deposited so as to have a thickness of 700 nm, and $SiO_2$ is deposited so as to have a thickness of 700 nm. Accordingly the acoustic insulating layer 20 in which two W films and three $SiO_2$ films are alternately deposited can be formed. (Step a)

Next, in order to suppress parasitic capacitance coupling among the high acoustic impedance layers 10, the first metal electrode film 3, and the second metal electrode film 5, the high acoustic impedance layers 10 are eliminated by etching except portions immediately below the resonator. (Step b)

Next, as the thick flat layer 13, $SiO_2$ is deposited so as to have a thickness of 3000 nm or more by the deposition apparatus. Next, the acoustic insulating layer 20 is polished up to its upper portion by a chemical mechanical polishing method (CMP), thereby completing the acoustic insulating layer 20 whose surface is made flat. (Step c)

It is obvious that a method other than the above-described method can be employed without any problems in producing the acoustic insulating layer 20.

Next, a producing process of a resonator layer is performed. The support layer 2 made of AlN is deposited so as to have a thickness of 30 nm, the first metal electrode film 3 made of Mo is deposited so as to have a thickness of 400 nm, the piezoelectric thin film 4 made of AlN is deposited so as to have a thickness of 950 nm, the second metal electrode film 5 made of Mo is deposited so as to have a thickness of 400 nm, and the protection film 6 made of $SiO_2$ is deposited so as to have a thickness of 100 nm by the deposition apparatus. (Step d)

It should be noted that the producing (Step d) of the above-described five layers configuring the resonator layer is conducted by sequential deposition in vacuum without being opened to the air in mid-course of the deposition process.

Thereafter, the protection film 6 made of $SiO_2$ is patterned by an ordinary photoresist process and an ordinary etching process (the layers are appropriately opened to the air in mid-course of the process), so that the protection film 6 in a desired area is obtained.

Further, the second metal electrode film 5 made of Mo and the piezoelectric thin film 4 made of AlN are patterned by an ordinary photoresist process and an ordinary etching process, so that the second metal electrode film 5 and the piezoelectric thin film 4 in desired areas are obtained. Furthermore, the first metal electrode film 3 made of Mo is patterned by an ordinary photoresist process and an ordinary etching process, so that the first metal electrode film 3 in a desired area is obtained. At this time, areas where the pair of electrode pads connected with the respective metal electrode films are formed are also patterned at the same time by an ordinary photoresist process and an ordinary etching process. (Step e)

Next, the insulating layer 30 made of $SiO_2$ is selectively formed by a liftoff method in an area where the first metal electrode film 3, the piezoelectric thin film 4, and the second metal electrode film 5 are patterned on the same plane. (Step f)

Next, the pad electrodes 7 and a wire made of Al are selectively formed by the liftoff method so as to have a thickness of 400 nm. (Step g)

By employing the above-described manufacturing method, it is possible to obtain the piezoelectric thin film bulk acoustic wave resonator according to the first embodiment.

According to the first embodiment, the support film 2, the first metal electrode film 3, the piezoelectric thin film 4, the second metal electrode film 5, and the protection film 6 are sequentially deposited in vacuum, thereby obtaining a piezoelectric thin film bulk acoustic wave resonator which realizes a low cost and a good characteristic of film quality, and at the same time, has a high Q-value.

Figure 3:
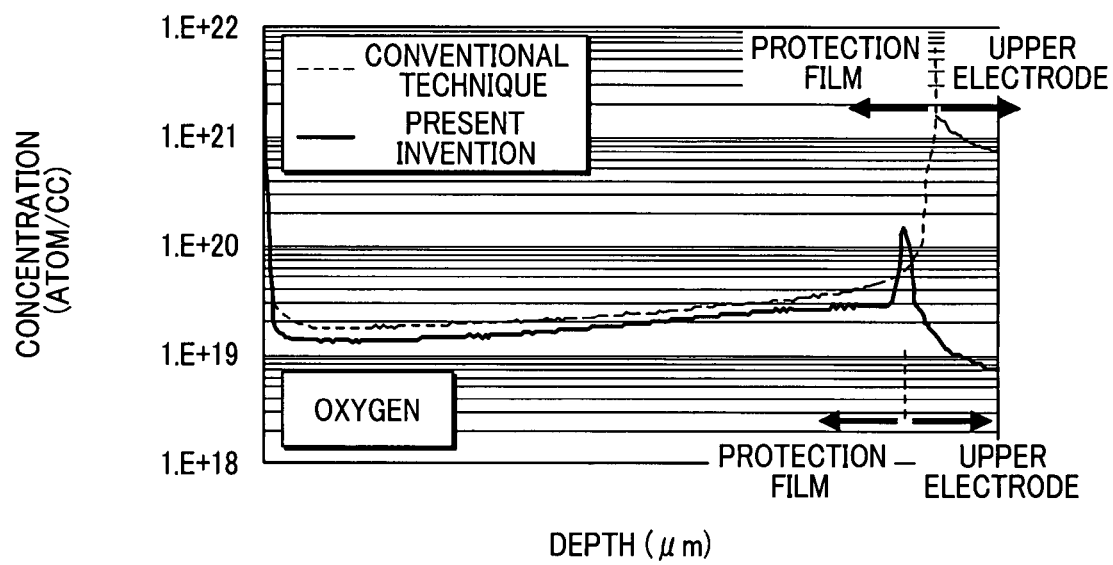
FIG. 3 is analysis data that shows effects of the device structure according to the first embodiment of the present invention, wherein the data shows oxygen contents in a metal electrode film and a piezoelectric thin film.
Figure 4:
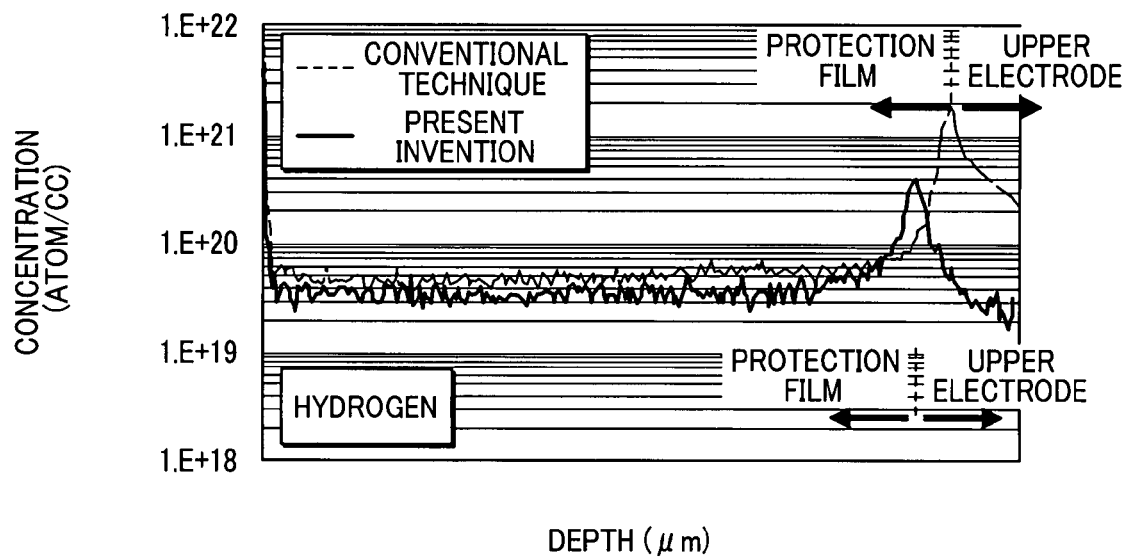
FIG. 4 is analysis data that shows effects of the device structure according to the first embodiment of the present invention, wherein the data shows hydrogen contents in the metal electrode film and the piezoelectric thin film.

FIGS. 3 and 4 are analysis data showing oxygen content and hydrogen content of the first metal electrode film 3 and the piezoelectric thin film 4 in the piezoelectric thin film bulk acoustic wave resonator according to the first embodiment of the present invention. As an analysis scheme, SIMS is employed, and a component analysis is conducted while etching the protection film 6 and then the second metal electrode film 5 from a surface of the element. AlN is used for the protection film 6 of a sample by which these measurement results were obtained, and the thickness thereof is about 1000 nm. Mo is used for the second metal electrode film 5, and the thickness thereof is 250 nm.

In a conventional method disclosed in U.S. Pat. No. 6,496,085 B2, or the like, the piezoelectric thin film 4 is formed after forming an etching mask on the first metal electrode film 3 by an ordinary photoresist process and patterning the same by an ordinary etching process. Thereafter, the second metal electrode film 5 is formed after forming an etching mask on the piezoelectric thin film 4 by an ordinary photoresist process and patterning the same by an ordinary etching process. Thereafter, the second metal electrode film 5 is formed after forming an etching mask on the second metal electrode film 5 by an ordinary photoresist process and patterning the same by an ordinary etching process. Therefore, the first metal electrode film 3, the piezoelectric thin film 4, and the second metal electrode film 5 are exposed in the air in the manufacturing process.

On the other hand, in the present invention, the first metal electrode film 3, the piezoelectric thin film 4, the second metal electrode film 5, and the protection film 6 are sequentially deposited in vacuum, and then an etching mask is formed by an ordinary photoresist process. Thereafter, the protection film 6, the second metal electrode film 5, the piezoelectric thin film 4, and the first metal electrode film 3 are patterned by an ordinary etching process. Therefore, the respective films of the laminated structure including the second metal electrode film 5 and the protection film 6 come into contact with each other through an interface their between, respectively.

As being apparent from the results of FIGS. 3 and 4, according to the structure of the present invention, it can be understood that an oxygen amount and a hydrogen amount each contained in the protection film (AlN) and the second metal electrode film (Mo) are lowered. The fact shows that the second metal electrode film comes into contact with the protection film through an interface so as to prevent a change of the material in the epidermic portion of the metal electrode film.

On the other hand, in the case of the conventional method, the inner portions of the respective piezoelectric film layer and the metal electrode film layer are different from the epidermic portions thereof in material composition due to the mixture of oxygen and nitrogen into the inner portions of the piezoelectric thin film and the metal electrode film. Accordingly, it is obvious that the fact has an adverse effect on element characteristics of the piezoelectric thin film bulk acoustic wave resonator. This directly leads to an increment of a resistance value, which causes deterioration of the Q-value of the piezoelectric thin film bulk acoustic wave resonator. Application of the piezoelectric thin film bulk acoustic wave resonator in which the Q-value is deteriorated involves a serious problem due to damage of a steep filter characteristic that is a feature of the piezoelectric thin film bulk acoustic wave resonator filter.

Figure 5:
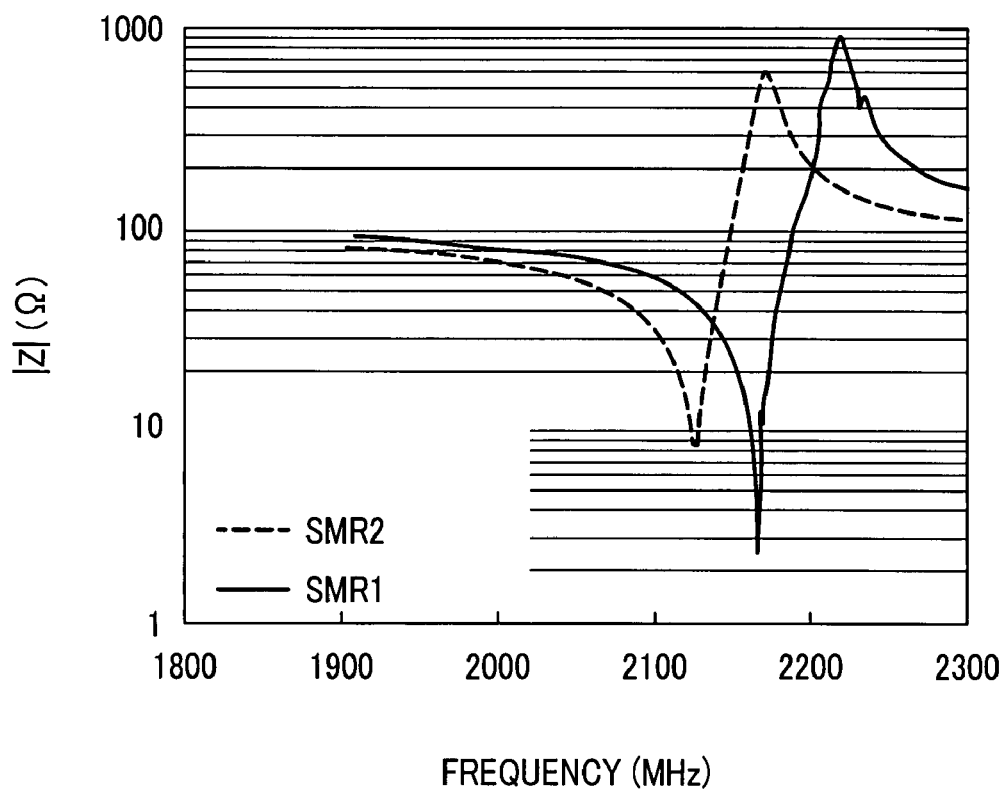
FIG. 5 is a diagram showing an example of an impedance-frequency characteristic relation between the piezoelectric thin film bulk acoustic wave resonator according to the first embodiment of the present invention and a piezoelectric thin film bulk acoustic wave resonator manufactured by a conventional non-sequential deposition method.

FIG. 5 is a diagram showing one example of an impedance/frequency characteristic relation between the piezoelectric thin film bulk acoustic wave resonator (SMR1) manufactured by the sequential deposition method of the first embodiment of the present invention and the piezoelectric thin film bulk acoustic wave resonator (SMR2) manufactured by a conventional non-sequential deposition method, both of which were described using FIGS. 3 and 4. The Q-value is considerably improved in the first embodiment, compared to the conventional method.

It should be noted that as the protection film 6 becomes thinner, the function as a protection film is insufficient, and as the protection film 6 becomes thicker, it has an adverse effect on frequency characteristics and the like. Therefore, it is desirable to set the thickness of the protection film in a range of 50 nm to 150 nm.

In the structure of the first embodiment, an $SiO_2$ film is laminated as the protection film 6 on the second metal electrode film 5 of the resonator element, and, at the same time, the film thickness of the protection film is optimized, so that a resonance frequency characteristic and a temperature characteristic are effectively improved. The film thickness of the protection film 6 is determined based on a relation between the $SiO_2$ film thickness and the temperature characteristic, and it is advantageous to adjust the thickness of the protection film 6 in a range of 500 nm or less in order to improve the temperature characteristic and the like. Thus, it is desirable to appropriately set the thickness of the protection film 6 in a range of 50 nm to 600 nm as a whole.

As described above, according to the first embodiment, the first metal electrode film, the piezoelectric thin film, the second metal electrode film, and the protection film are sequentially deposited by the same apparatus, so that deterioration of film quality due to oxidization of each thin film can be prevented to the minimum degree, and the piezoelectric thin film bulk acoustic wave resonator with a good characteristic of film quality can be formed. Further, by adjusting the film thickness of the protection film, it is also possible to improve a resonance frequency characteristic and a temperature characteristic.

Second Embodiment

Figure 6:
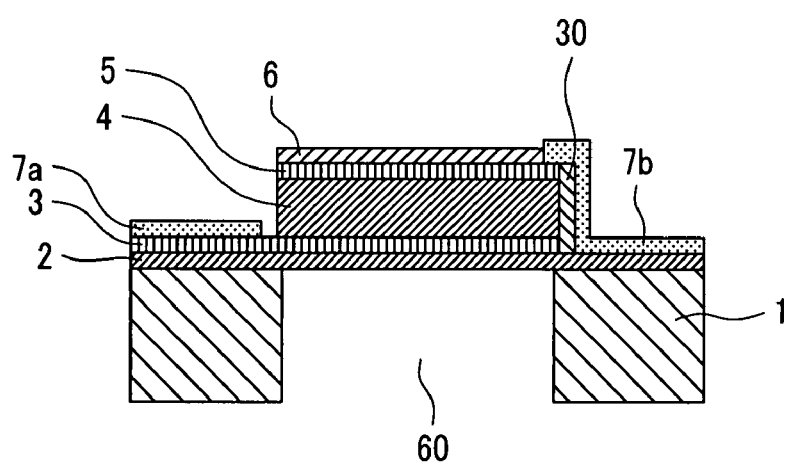
FIG. 6 is a sectional structured view showing an example of a piezoelectric thin film bulk acoustic wave resonator as a second embodiment of the present invention.
Figure 7:
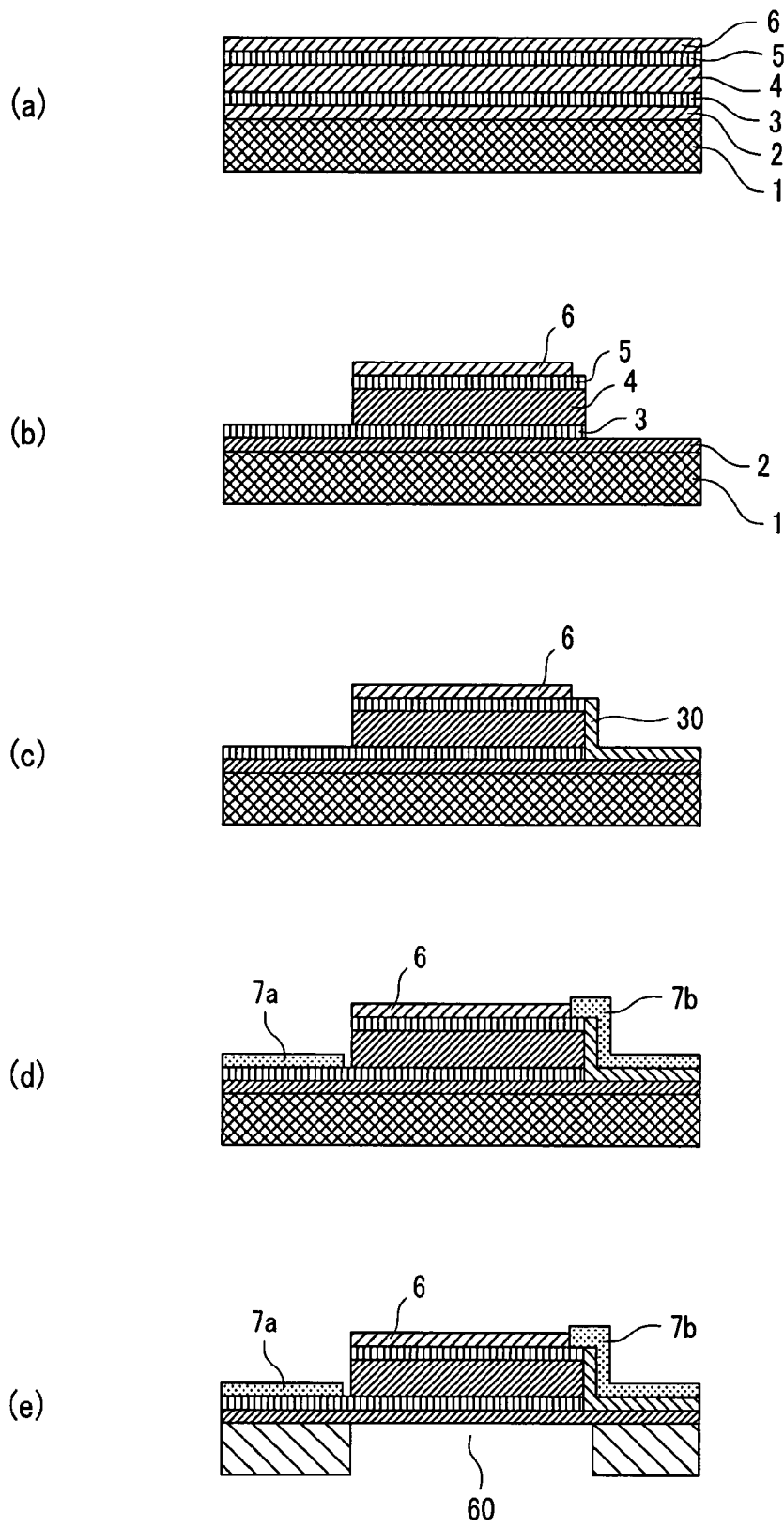
FIG. 7A to FIG. 7E are sectional structured views showing an example of a manufacturing method of the piezoelectric thin film bulk acoustic wave resonator shown in FIG. 6 in the order of manufacturing processes.
Figure 8:
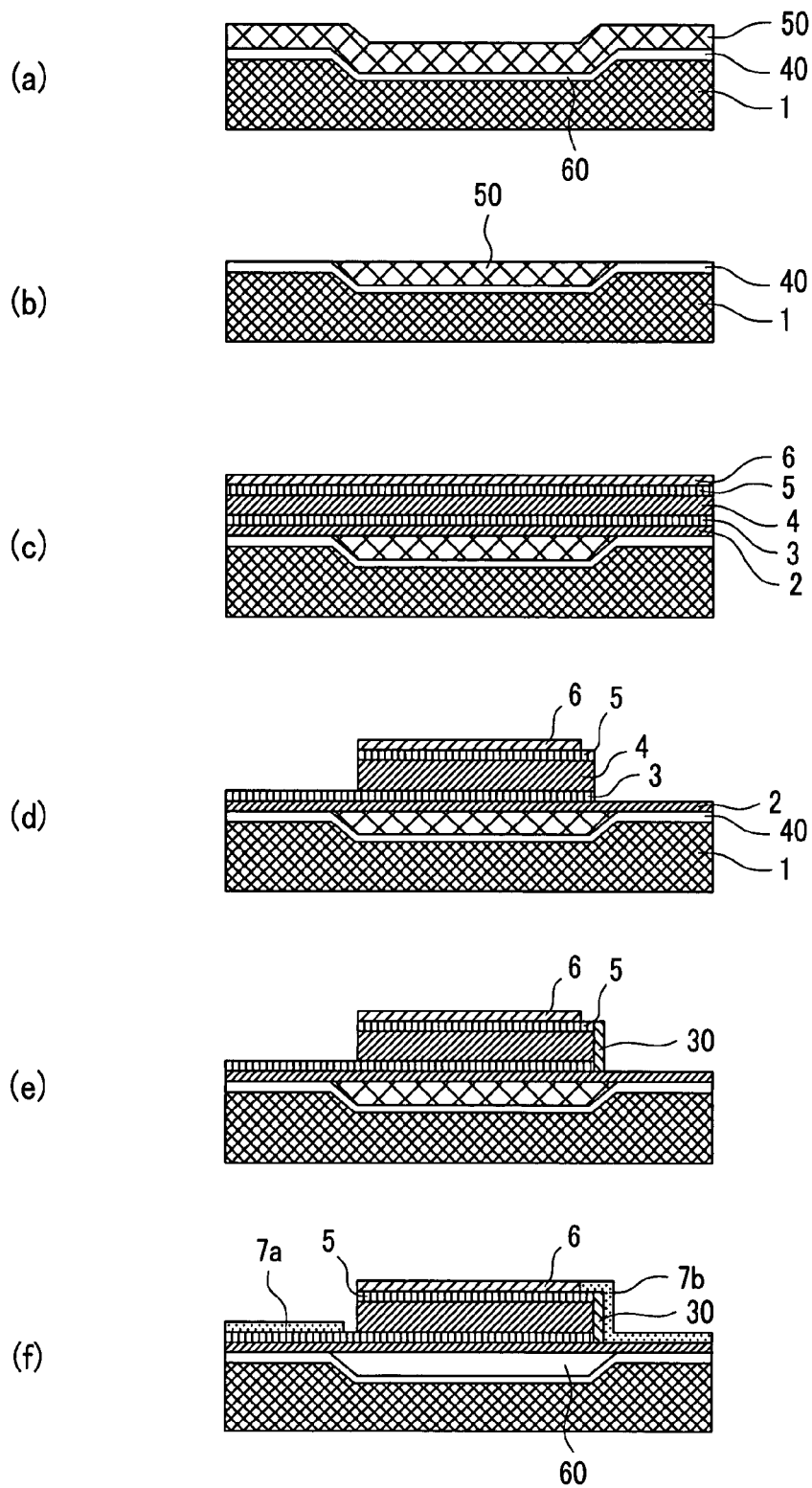
FIG. 8A to FIG. 8F are sectional structured views showing an example of a manufacturing method of a piezoelectric thin film bulk acoustic wave resonator as a third embodiment according to the present invention in the order of manufacturing processes.

FIG. 6 is a sectional structured view showing one example of a piezoelectric thin film bulk acoustic wave resonator of a second embodiment according to the present invention. The second embodiment is characterized in that a laminated structure which includes a piezoelectric thin film 4, and a first metal electrode film 3 and a second metal electrode film 5 that interpose at least a part of the piezoelectric thin film 4 is produced, and an AlN thin film is formed as a protection film 6 so as to cover the second metal electrode film 5 which serves as an upper electrode.

At this time, a support film 2, the first metal electrode film 3, the piezoelectric thin film 4, the second metal electrode film 5, and the protection film 6 made of AlN are sequentially deposited in vacuum, so that deterioration of film quality due to oxidization of each thin film can be prevented to the minimum degree. Therefore, the piezoelectric thin film bulk acoustic wave resonator with a good characteristic of film quality can be manufactured.

The second embodiment is an embodiment in which a piezoelectric thin film bulk acoustic wave resonator of an FBAR type is exemplified, and an acoustic insulating layer 20 is produced in such a manner that an insulating substrate 1 immediately below a resonator is etched from a back surface thereof to form a cavity 60.

Hereinafter, one example of a manufacturing method of the piezoelectric thin film bulk acoustic wave resonator according to the second embodiment will be described along with FIG. 7A to FIG. 7E.

First, on a high-resistance silicon substrate as the insulating substrate 1, the support layer 2 made of AlN is deposited so as to have a thickness of 30 nm, the first metal electrode film 2 made of Mo is deposited so as to have a thickness of 400 nm, the piezoelectric thin film 4 made of AlN is deposited so as to have a thickness of 950 nm, the second metal electrode film 5 made of Mo is deposited so as to have a thickness of 400 nm, and the protection film 6 made of AlN is deposited so as to have a thickness of 50 nm. The above-described five layers are formed by sequential deposition in vacuum without being opened to the air in mid-course of the deposition process. (Step a)

Thereafter, the protection film 6 made of AlN is patterned by an ordinary photoresist process and an ordinary etching process, so that the protection film 6 in a desired area is obtained. Further, the second metal electrode film 5 made of Mo and the piezoelectric thin film 4 made of AlN are patterned by an ordinary photoresist process and an ordinary etching process, so that the upper electrode and the piezoelectric thin film 4 in desired areas are obtained. Furthermore, the first metal electrode film 3 made of Mo is patterned by an ordinary photoresist process and an ordinary etching process, so that the lower electrode in a desired area is obtained. (Step b)

Next, an insulating layer 30 made of $SiO_2$ is selectively formed by a liftoff method in a area where the first metal electrode film 3, the piezoelectric thin film 4, and the second metal electrode film 5 are patterned on the same plane. (Step c)

Next, pad electrodes 7 and a wire made of Al are selectively formed by the liftoff method so as to have a thickness of 400 nm. (Step d)

Next, in order to form the cavity 60 in a lower portion of the piezoelectric thin film bulk acoustic wave resonator, a resist is formed as an etching mask along an area, on a back surface of the insulating substrate 1, corresponding to the piezoelectric thin film bulk acoustic wave resonator. Next, dry etching is performed by Deep-RIE from a back surface of the insulating substrate 1 so as to form the cavity 60 in a substantially vertical shape. (Step e)

By employing the above-described manufacturing method, the piezoelectric thin film bulk acoustic wave resonator according to the second embodiment can be obtained.

Also in the second embodiment, the first metal electrode film, the piezoelectric thin film, the second metal electrode film, and the protection film are sequentially deposited by the same apparatus, so that deterioration of film quality due to oxidization of each thin film can be prevented to the minimum degree, and the piezoelectric thin film bulk acoustic wave resonator with a good characteristic of film quality can be formed. Further, by adjusting the film thickness of the protection film, it is also possible to improve a resonance frequency characteristic.

Third Embodiment

FIG. 8A to FIG. 8F show one example of a manufacturing method of a piezoelectric thin film bulk acoustic wave resonator of a third embodiment according to the present invention. First, a cavity 60 having a depth of 800 nm is provided on a high-resistance silicon substrate 1 as an insulating substrate by an ordinary photoresist process and an ordinary etching process. Next, a barrier layer 40 made of $Si_3N_4$ is deposited so as to have a thickness of 100 nm on a surface of the insulating substrate 1 where the cavity 60 is formed, and further, a sacrificial layer 50 made of phosphoric-silicate glass (PSG) is deposited so as to have a thickness of 1000 nm. (Step a)

Next, the sacrificial layer 50 is made flat by a chemical mechanical polishing method (CMP) in such a manner that a surface of the barrier layer 40 formed on the insulating substrate 1 is exposed, and only the cavity 60 is filled with the sacrificial layer 50. (Step b)

Next, on the insulating substrate 1 in which the cavity 60 is filled with the sacrificial layer 50 and whose surface is made flat, a support layer 2 made of AlN is deposited so as to have a thickness of 30 nm, a first metal electrode film 3 made of Mo is deposited so as to have a thickness of 400 nm, a piezoelectric thin film 4 made of AlN is deposited so as to have a thickness of 950 nm, a second metal electrode film 5 made of Mo is deposited so as to have a thickness of 400 nm, and a protection film 6 made of $SiO_2$ is deposited so as to have a thickness of 100 nm. Forming of all five layers of the support layer 2, the first metal electrode film 3, the piezoelectric thin film 4, the second metal electrode film 5, and the protection film 6 is conducted by sequential deposition in vacuum without being opened to the air in mid-course of the deposition. (Step c)

Thereafter, the protection film 6 made of $SiO_2$ is patterned by an ordinary photoresist process and an ordinary etching process, so that the protection film 6 in a desired area is obtained. Further, the second metal electrode film 5 made of Mo and the piezoelectric thin film 4 made of AlN are patterned by an ordinary photoresist process and an ordinary etching process, so that the second metal electrode film 5 and the piezoelectric thin film 4 in desired areas are obtained. Furthermore, the first metal electrode film 3 made of Mo is patterned by an ordinary photoresist process and an ordinary etching process, so that the first metal electrode film 3 in a desired area is obtained. (Step d)

Next, an insulating layer 30 made of $Si_3N_4$ is selectively formed by a liftoff method in an area where the first metal electrode film 3, the piezoelectric thin film 4, and the second metal electrode film 5 are patterned on the same plane. (Step e)

Next, pad electrodes 7 and a wire made of Al are selectively formed by the liftoff method so as to have a thickness of 400 nm.

Next, in order to form the cavity 60 in a lower area of the piezoelectric thin film bulk acoustic wave resonator, PSG of the sacrificial layer 50 is removed in a liquid solution containing hydrofluoric acid (HF). In the removal process of the sacrificial layer 50, $SiO_2$ of the protection film 6 can be also removed at the same time. (Step f)

The piezoelectric thin film bulk acoustic wave resonator in which $SiO_2$ of the protection film 6 is removed is immediately airtight sealed. Therefore, deterioration of film quality due to oxidization or nitridation of the thin film accompanied by mixture of oxygen, nitrogen, or moisture into the second metal electrode film 5 can be prevented to the minimum degree.

By employing the above-described manufacturing method, deterioration of film quality due to oxidization of each thin film can be prevented to the minimum degree, so that the piezoelectric thin film bulk acoustic wave resonator with a good characteristic of film quality can be obtained.

Since the characteristics shown in FIG. 6 are utilized also in the third embodiment, the material of the protection film 6 is left as a material different from that of the sacrificial layer, so that a resonance frequency characteristic and a temperature characteristic can be improved.

Fourth Embodiment

Next, as a fourth embodiment of the present invention, an example in which a thin film tuning-fork-shape distorting oscillator is applied will be described with reference to FIG. 9 and FIGS. 10A to 10E.

Figure 9:
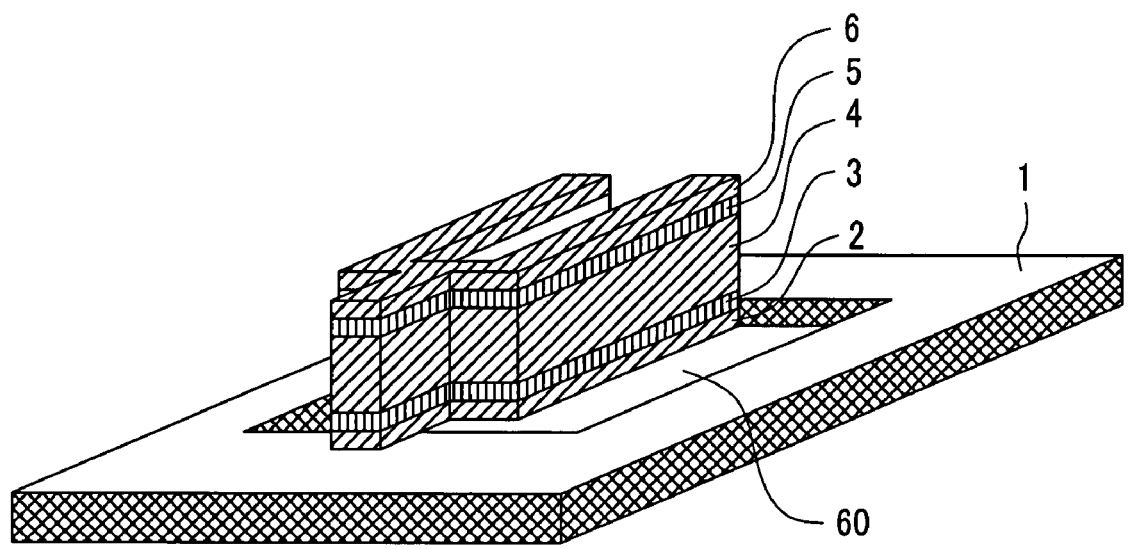
FIG. 9 is a perspective view showing an appearance of a thin film tuning-fork-shape distorting oscillator as a fourth embodiment of the present invention.
Figure 10:
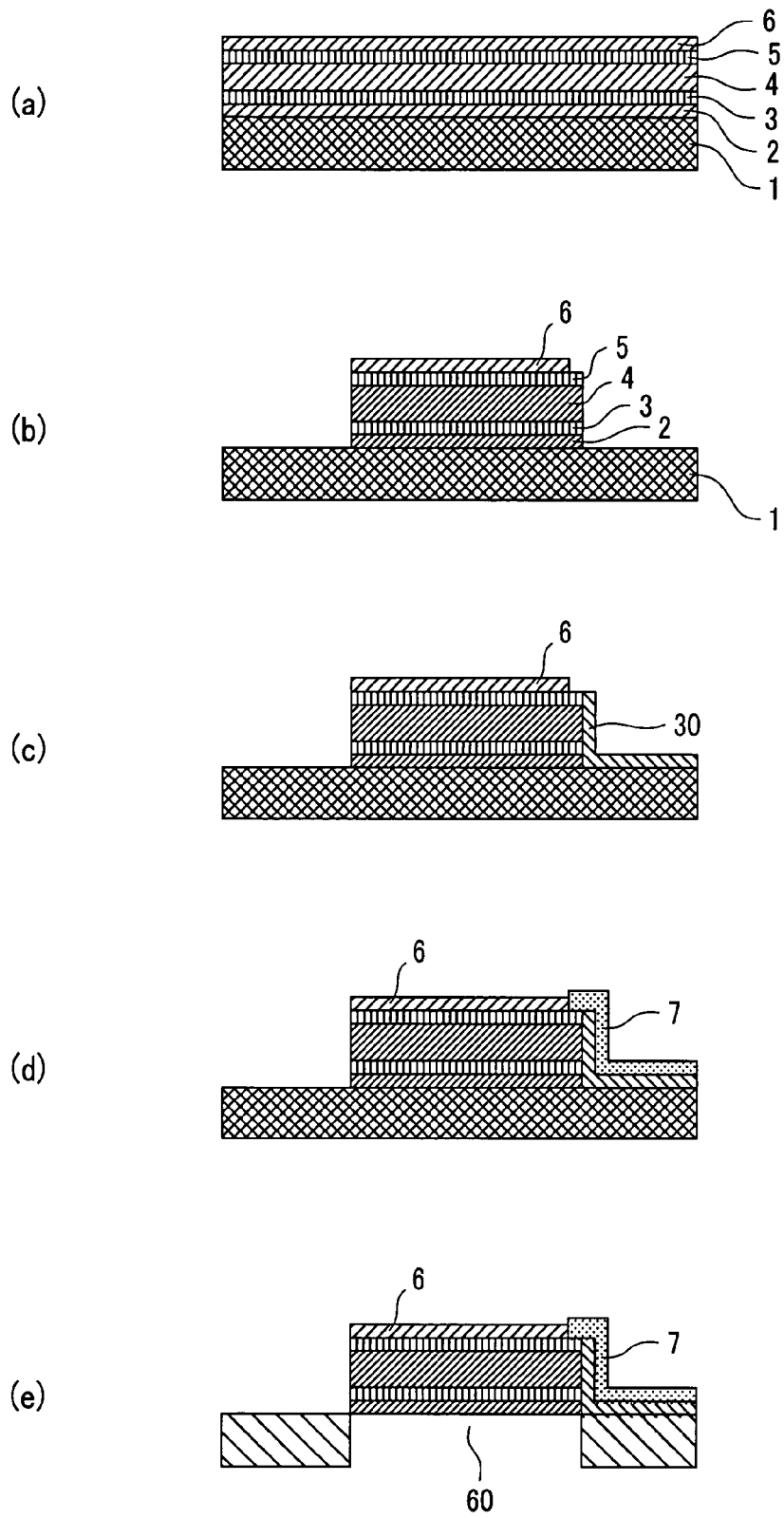
FIG. 10A to FIG. 10E are sectional structured views showing an example of a manufacturing method of the thin film tuning-fork-shape distorting oscillator as the fourth embodiment according to the present invention in the order of manufacturing processes.

First, FIG. 9 is a perspective view showing an appearance of the thin film tuning-fork-shape distorting oscillator of the fourth embodiment according to the present invention. The thin film tuning-fork-shape distorting oscillator is configured in such a manner that a thin film distorting oscillator is mounted on a high-resistance silicon substrate as an insulating substrate 1 in parallel with a surface of the insulating substrate 1, and the oscillator is formed in a tuning-fork shape. However, in order to apply the present invention, a first metal electrode film of a lower electrode is arranged on the whole surface of a piezoelectric thin film 4. That is, the thin film tuning-fork-shape distorting oscillator includes: a support film 2 made of AlN on the insulating substrate 1; and a laminated structure, on the support film 2, which has the piezoelectric thin film 4, and a first metal electrode film 3 and a second metal electrode film 5 that interpose the piezoelectric thin film 4. A protection film 6 made of $SiO_2$ is formed so as to cover the second metal electrode film 5 which serves as an upper electrode. The numeral 60 denotes a cavity provided on the insulating substrate 1 while corresponding to the laminated structure.

FIG. 10A to FIG. 10E show one example of a manufacturing method of the thin film tuning-fork-shape distorting oscillator of the fourth embodiment according to the present invention. Hereinafter, one example of the manufacturing method of the thin film tuning-fork-shape distorting oscillator of the fourth embodiment will be described.

On the high-resistance silicon substrate as the insulating substrate 1, the support film 2 made of AlN is deposited so as to have a thickness of 30 nm, the first metal electrode film 3 made of Mo is deposited so as to have a thickness of 400 nm, the piezoelectric thin film 4 made of AlN is deposited so as to have a thickness of 950 nm, the second metal electrode film 5 made of Mo is deposited so as to have a thickness of 400 nm, and the protection film 6 made of $SiO_2$ is deposited so as to have a thickness of 100 nm. Forming of the five layers is conducted by sequential deposition in vacuum without being opened to the air in mid-course of the deposition. (Step a)

Thereafter, the protection film 6 made of $SiO_2$ is patterned by an ordinary photoresist process and an ordinary etching process, so that the protection film 6 in a desired area is obtained. Further, the second metal electrode film 5 made of Mo is patterned by an ordinary photoresist process and an ordinary etching process, so that the second metal electrode film 5 in a desired shape is obtained. Further, the piezoelectric thin film 4 made of AlN, the first metal electrode film 3 made of Mo, and the support layer 2 made of AlN are patterned, so that the piezoelectric thin film 4, the first metal electrode film 3, and the support film 2 in a desired tuning-fork shape are obtained. (Step b)

Next, an insulating layer 30 made of $SiO_2$ is selectively formed by a liftoff method in at least one side area where the first metal electrode film 3, the piezoelectric thin film 4, and the second metal electrode film 5 are patterned on the same plane. (Step c)

Next, a pad electrode 7 and a wire made of Al are selectively formed by the liftoff method so as to have a thickness of 400 nm. (Step d)

Next, in order to form the cavity 60 in a lower area of the thin film tuning-fork-shape distorting oscillator, a resist as an etching mask is formed along an area, on a back surface of the insulating substrate 1, corresponding to the thin film tuning-fork-shape distorting oscillator, and then dry etching is performed from a back surface of the insulating substrate 1 by Deep-RIE to form the cavity 60 whose side walls are substantially vertical and whose cross-section is in a rectangular shape. (Step e)

By employing the above-described manufacturing method, the thin film tuning-fork-shape distorting oscillator according to the fourth embodiment can be obtained.

According to the fourth embodiment, the first metal electrode film, the piezoelectric thin film, the second metal electrode film, and the protection film are sequentially deposited by the same apparatus, so that deterioration of film quality due to oxidization of each thin film can be prevented to the minimum degree, and the thin film tuning-fork-shape distorting oscillator with a good characteristic of film quality can be formed. Further, by adjusting the film thickness of the protection film, a resonance frequency characteristic and a temperature characteristic can be improved.

MODIFIED EXAMPLE

In the above-described respective embodiments of the present invention, the high-resistance silicon substrate is used as the insulating substrate 1. However, a substrate made of an insulating material, for example, a glass substrate, a compound semiconductor substrate, a high-resistance silicon substrate, a piezoelectric substrate, or the like can be applied to the insulating substrate 1. Further, a semiconductor substrate, a semiinsulating substrate, or a conductor substrate, each surface of which is covered with an insulating film typified by silicon oxide can be also applied to the insulating substrate 1.

Further, Mo is used as a material of the first metal electrode film 3 and the second metal electrode film 5. However, other conductive materials such as Ta, Ni, Nb, Au, Pt, Cu, Pd, Ti, and W can be similarly used.

Further, AlN is used as a material of the piezoelectric thin film 4. However, other materials such as ZnO, PZT, $PbTiO_3$, and $BaTiO_3$ can be similarly used.

Further, phosphoric-silicate glass is used as a material of the sacrificial layer 50. However, other materials such as $SiO_2$, Ge, and Ti can be similarly used as long as they are easy to etch with hydrofluoric acid.

It should be noted that the thickness of each layer is an example, and it is obvious that the design can be appropriately changed in accordance with a material to be used and a necessary resonance frequency.

In order to realize downsizing by increasing a package density of a piezoelectric thin film bulk acoustic wave resonator and a filter using the same, two piezoelectric thin film bulk acoustic wave resonators may be deposited above and below on the substrate. In this case, the upper and lower piezoelectric thin film bulk acoustic wave resonators are sequentially deposited on the substrate by the same deposition apparatus. In addition, the protection film is sequentially deposited by the same apparatus on the second metal electrode film of the upper piezoelectric thin film bulk acoustic wave resonator. Thereby, deterioration of film quality due to oxidization of each thin film can be prevented to the minimum degree, and the piezoelectric thin film bulk acoustic wave resonator with a good characteristic of film quality can be formed.

Fifth Embodiment

Figure 11:
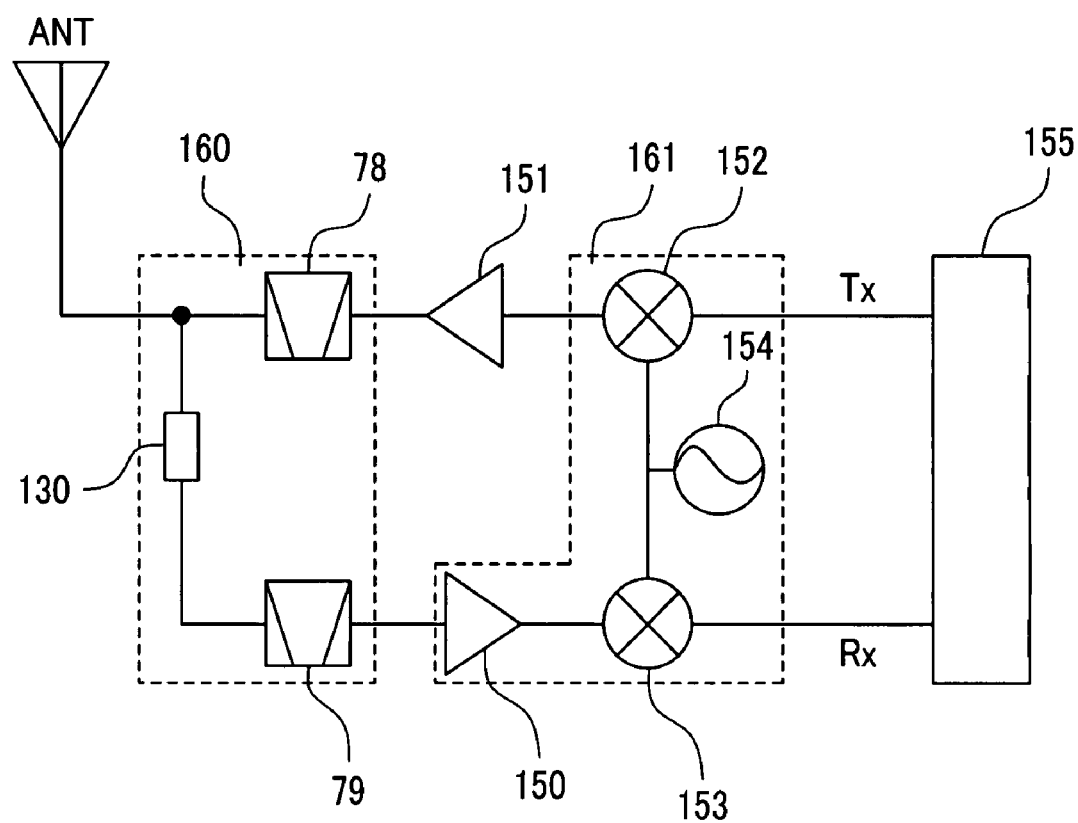
FIG. 11 is a circuit block diagram showing one example of a front end portion in a common mobile phone of which the present invention is applicable.

FIG. 11 shows one example of a block circuit diagram including high frequency modules in a common mobile phone. Here, there will be described a case that a piezoelectric thin film bulk acoustic wave resonator filter using piezoelectric thin film bulk acoustic wave resonators according to the invention is configured on a single substrate.

The numerals 78 and 79 denote a transmit filter and a receive filter, respectively. The numerals 130 is a phase shifter, 150 is a low noise amplifier, 151 is a power amplifier module, 152 is a transmit mixer, 153 is a receive mixer and 154 is a synthesizer, respectively. The numeral 155 is a baseband unit, 160 is a transmit/receive switch module and 161 is a high frequency integrated circuit module, respectively. The transmit/receive switch module 160, the high frequency integrated circuit module 161, and the power amplifier module 151 are independently formed into modules, or integrally formed into a module as a chipset for a mobile phone. The piezoelectric thin film resonators described in the first to fourth embodiments of the present invention are used as, for example, resonant elements of a ladder type configuring a series-arm resonators and a shunt-arm resonators, and accordingly, the transmit filter 78 and the receive filter 79 can be configured.

In FIG. 11, a high frequency receive signal Rx received by an antenna ANT passes through the phase shifter 130, and is input to the low noise amplifier 150 for amplifying the high frequency receive signal Rx through the receive filter 79 through which only a predetermined receive-band frequency signal passes while removing an image frequency signal. The high frequency receive signal Rx amplified by the low noise amplifier 150 is transmitted to the baseband unit 155 through the receive mixer 153 to be converted to a baseband.

On the other hand, a high frequency transmit signal Tx transmitted from the baseband unit 155 is input to the power amplifier module 151 for amplifying the high frequency transmit signal Tx through the transmit mixer 152 for producing a modulation radio frequency signal. The high frequency transmit signal Tx amplified by the power amplifier module 151 is emitted as a radio wave from the antenna through the transmit filter 78 through which only a predetermined transmit-band frequency signal passes. A common mobile phone includes the phase shifter 130 that enables common use of the antenna between a receive unit and a transmit unit, the synthesizer 154, and the baseband unit 155 that performs a signal process for a receive signal and a transmit signal.

Each of such the transmit filter 78 and the receive filter 79 for high frequency signals used at a front end portion can be configured by an assembly of plural piezoelectric thin film bulk acoustic wave resonators. The block diagram shown in FIG. 11 represents a case of a single-band mobile phone. However, even in the configuration of a multiband mobile phone such as dual-band, triple-band and quad-band, the present invention can be similarly applied, and the configuration is not limited to that shown in the embodiment.

In the fifth embodiment, as an example of a case of the transmit frequency Tx of 1.85 GHz to 1.91 GHz and the receive frequency Rx of 1.93 GHz to 1.99 GHz, the transmit filter 78 and the receive filter 79 which are configured by the piezoelectric thin film bulk acoustic wave resonator filters composed of plural piezoelectric thin film bulk acoustic wave resonators will be described.

Figure 12:
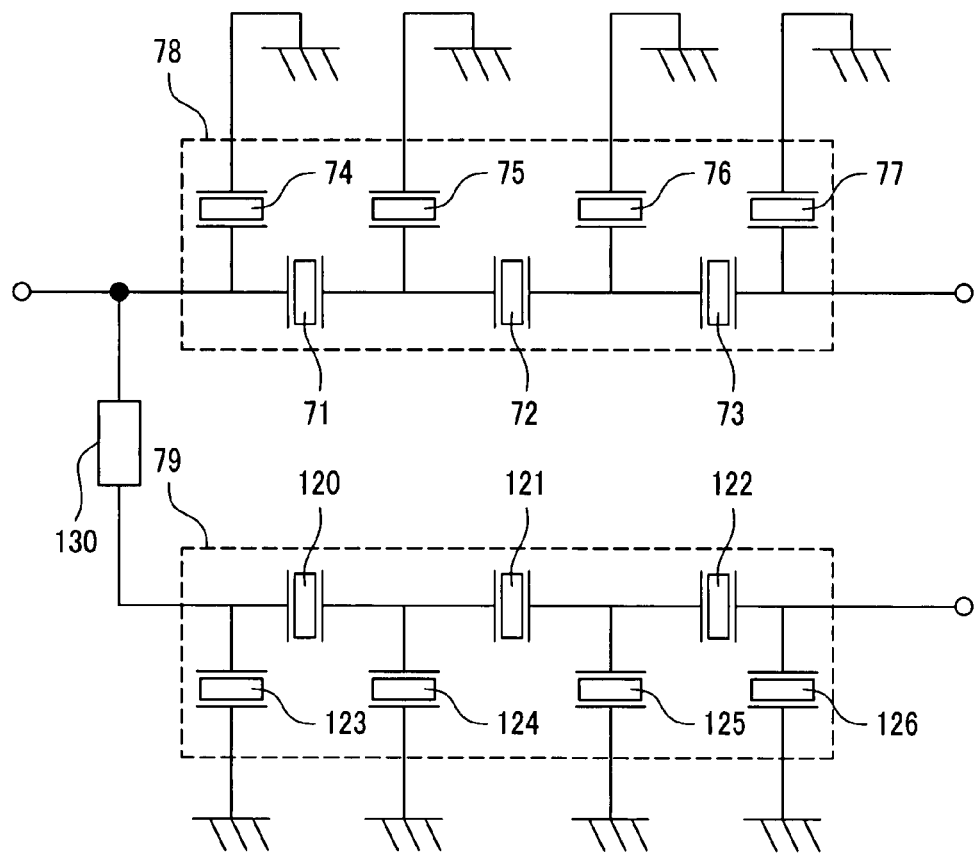
FIG. 12 is a circuit block diagram of a transmit filter section and a receive filter section configured by an arrangement of the piezoelectric thin film bulk acoustic wave resonators of the front end portion shown in FIG. 11.

FIG. 12 is one example of a circuit block diagram of the transmit/receive switch module 160 shown in FIG. 11. The transmit filter 78 is configured by an arrangement of piezoelectric thin film bulk acoustic wave resonators 71 to 77 enclosed by a dotted line, and the receive filter 79 is configured by an arrangement of piezoelectric thin film bulk acoustic wave resonators 120 to 126 enclosed by a dotted line. The arrangement of the resonators shown herein is an example, and is not limited to that shown in the embodiment because the arrangement of the resonators is determined based on a desired filter characteristic. A circuit used as the phase shifter 130 is well known, and is configured by an inductor and a conductor, or a λ/4 transmitssion line.

Figure 13A:
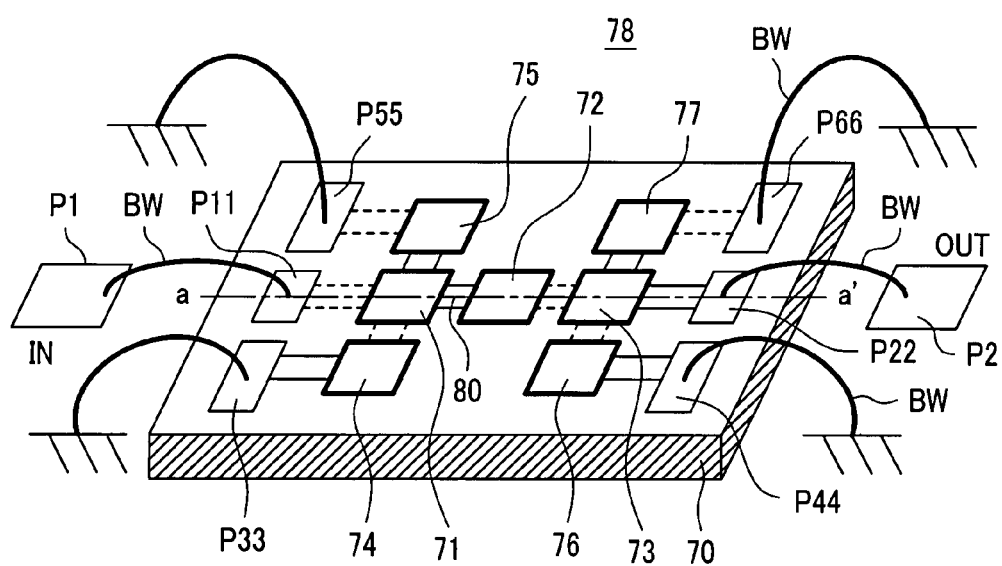
FIG. 13A is a schematic appearance perspective view in which the transmit filter composed of the piezoelectric thin film bulk acoustic wave resonators according to the present invention is produced on a single substrate.

FIG. 13A shows a schematic appearance perspective view in the case where the transmit filter 78 is produced on a single substrate 70, as an example. Further, FIG. 13B shows a cross-section taken along the line a-a of FIG. 13A.

Here, each of the piezoelectric thin film bulk acoustic wave resonators 71 to 77 is represented by a quadrangle. However, the shape is not limited to the quadrangle because the shape of the piezoelectric thin film bulk acoustic wave resonator is determined based on a desired filter characteristic. The piezoelectric thin film bulk acoustic wave resonators 71 to 73 which are connected with each other through a wire 80 configure series-arm resonators, and the piezoelectric thin film bulk acoustic wave resonators 74 to 77 configure shunt-arm resonators.

Figure 13B:
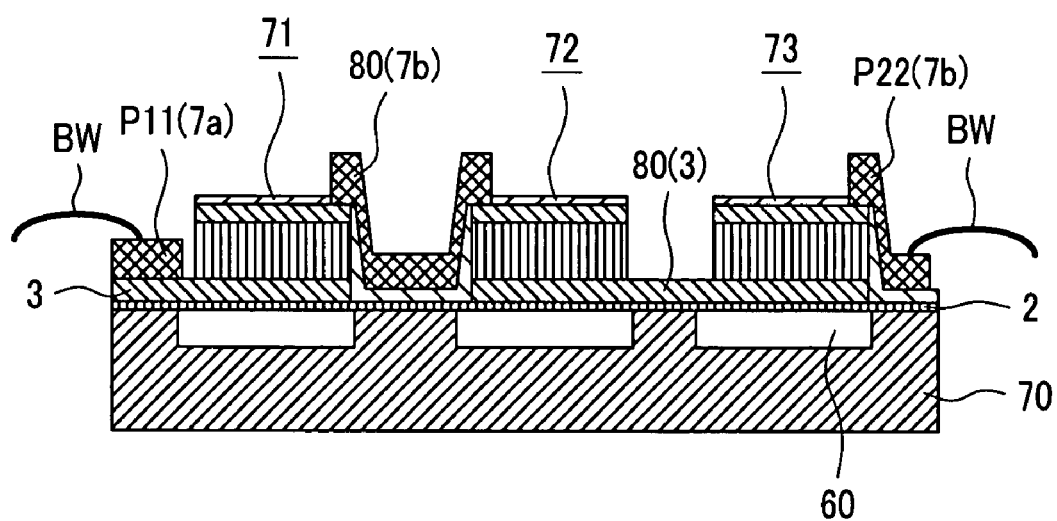
FIG. 13B is a diagram showing a cross-section taken along the line a-a of FIG. 13A.

In FIGS. 13A and 13B, a solid line that connects the piezoelectric thin film bulk acoustic wave resonators with each other shows the wire 80 through which an upper electrode layer 5 of the piezoelectric thin film bulk acoustic wave resonator is connected with a pad electrode 7 (7a, 7b), and a dotted line shows the wire 80 which is configured by a lower electrode layer 3 of the piezoelectric thin film bulk acoustic wave resonator (or which is connected with a lower electrode layer).

The reference numeral P1 denotes an input wire pad to which a transmit signal is transmitted from an inner circuit (not shown), and is connected with a bonding wire BW and an input pad P11 (namely, pad electrode 7a) of the filter that is connected with the piezoelectric thin film bulk acoustic wave resonator 71 of the transmit filter 78. Further, the input wire pad is connected with an output pad P22 (namely, pad electrode 7b) of the filter through the piezoelectric thin film bulk acoustic wave resonators 72 and 73 which are series-connected through the wire 80 (the pad electrode 7b and the lower electrode layer 3). The output pad P22 of the filter is connected with a pad P2 which is connected with an antenna (not shown), through the bonding wire BW. Each of wire pads P33 and P44 connected with the upper electrode layers 5 of the piezoelectric thin film bulk acoustic wave resonators 74 and 76 and wire pads P55 and P66 connected with the lower electrode layers 3 of the piezoelectric thin film bulk acoustic wave resonators 75 and 77 is connected with a ground pad (not shown) through the bonding wire BW.

As described above, the transmit filter 78 shown in the circuit diagram of FIG. 12 is formed on the single substrate 70. The receive filter 79 is also similarly formed on the single substrate 70. Accordingly, the transmit/receive switch module 160, the high frequency integrated circuit module 161, and the power amplifier module 151 can be independently formed into modules, or integrally formed into a module in a simple manner as a chipset for a mobile phone.

In the fifth embodiment, since the piezoelectric thin film resonator filter in any embodiment of the above-described invention is used, an element area can be reduced, thereby realizing downsizing and a low cost of a high frequency module.

The fifth embodiment shown herein is an example of using the bonding wire BW to connect the inner circuit with the transmit filter. However, it is obvious that the fifth embodiment can be applied to other package methods such as bump bonding, and is not limited thereto. Further, it is obvious that the present invention is not limited to a filter for a mobile phone, but can be applied to various applications as a filter for wireless communications.

What is claimed is:

1. A piezoelectric thin film resonator comprising:
   a substrate;
   a laminated structure including first metal electrode film formed in a vacuum, a piezoelectric thin film formed on the first metal electrode film and a second metal electrode film formed on the piezoelectric thin film, the laminated structure being formed on the substrate;
   an acoustic insulating layer formed on the substrate at a position corresponding to the laminated structure, and
   a protection film formed on the second metal electrode film wherein an interface between the protection film and the second metal electrode film has a concentration of at least one of oxygen and hydrogen that is less than 1.E+21 atoms/cc.

2. The piezoelectric thin film resonator according to claim 1,
   wherein plane shapes of the piezoelectric thin film and the second metal electrode film are substantially the same, and
   wherein the protection film is formed on an upper surface of the second metal electrode film so as to cover the whole surface of an area where the laminated structure substantially functions as a resonator.

3. The piezoelectric thin film resonator according to claim 2, further comprising:
   an electrode pad connected with the second metal electrode film is provided,
   wherein the substantially whole upper surface of the second metal electrode film is covered with the protection film and the electrode pad.

4. The piezoelectric thin film resonator according to claim 1,
   wherein the second metal electrode film comes into contact with the protection film through an interface.

5. The piezoelectric thin film resonator according to claim 4,
   wherein the piezoelectric thin film resonator is a piezoelectric thin film bulk acoustic wave resonator,
   wherein the piezoelectric thin film resonator further comprises:
   a support film formed on the acoustic insulating layer, and
   wherein the laminated structure is provided on the support film.

6. The piezoelectric thin film resonator according to claim 4,
   wherein the piezoelectric thin film resonator is a thin film tuning-fork-shape distorting oscillator,
   wherein the piezoelectric thin film resonator further comprises:
   a support film formed on the acoustic insulating layer is provided, and
   wherein the laminated structure is provided on the support film.

7. The piezoelectric thin film resonator according to claim 4,
   wherein the acoustic insulating layer is formed on the substrate at a position corresponding to the laminated structure, and
   wherein the acoustic insulating layer is a Bragg reflection layer in which low acoustic impedance layers and high acoustic impedance layers are alternately laminated.

8. The piezoelectric thin film resonator according to claim 4,
   wherein the acoustic insulating layer is formed on the substrate at a position corresponding to the laminated structure, and
   wherein the acoustic insulating layer is a cavity formed in the substrate.

9. The piezoelectric thin film resonator according to claim 1,
   wherein the protection film contains silicon dioxide, and has a thickness of 50 nm to 600 nm.

10. The piezoelectric thin film resonator according to claim 1,
    wherein the protection film contains aluminum nitride, and has a thickness of 50 nm to 600 nm.

11. The piezoelectric thin film resonator according to claim 1,
    wherein the laminated structure is comprised of two laminated structures laminated above and below, and
    wherein the protection film is formed on an upper surface of the second metal electrode film in the upper laminated structure.

12. A piezoelectric thin film bulk acoustic wave resonator filter comprising:
    a substrate; and
    a plurality of piezoelectric thin film bulk acoustic wave resonators provided on the substrate,
    wherein at least one piezoelectric thin film bulk acoustic wave resonator includes:
    a laminated structure including a first metal electrode film formed in a vacuum, a piezoelectric thin film formed on the first metal electrode film and a second metal electrode film formed on the piezoelectric thin film, the laminated structure being formed on the substrate;
    an acoustic insulating layer formed on the substrate at a position corresponding to the laminated structure, and a protection film formed on the second metal electrode film wherein an interface between the protection film and the second metal electrode film has a concentration of at least one of oxygen and hydrogen that is less than 1.E+21 atoms/cc.

13. The piezoelectric thin film bulk acoustic wave resonator filter according to claim 12,
wherein the protection film contains silicon dioxide.

14. The piezoelectric thin film bulk acoustic wave resonator filter according to claim 12,
wherein the protection film contains aluminum nitride.

15. The piezoelectric thin film bulk acoustic wave resonator filter according to claim 12,
wherein the second metal electrode film comes into contact with the protection film through an interface.

16. The piezoelectric thin film bulk acoustic wave resonator filter according to claim 15, further comprising:
a plurality of first piezoelectric thin film bulk acoustic wave resonators which are series-connected; and
a plurality of second piezoelectric thin film bulk acoustic wave resonators which are parallel-connected,
wherein at least one piezoelectric thin film bulk acoustic wave resonator includes a first electrode pad connected with the first metal electrode film and a second electrode pad connected with the second metal electrode film, and
wherein the substantially whole upper surface of the second metal electrode film is covered with the protection film and the second electrode pad.

* * * * *